(12) United States Patent
Takahashi et al.

(10) Patent No.: US 9,336,871 B2
(45) Date of Patent: May 10, 2016

(54) RESISTANCE CHANGE MEMORY

(71) Applicants: Masahiro Takahashi, Seongnam-si (KR); Dong Keun Kim, Icheon-si (KR); Hyuck Sang Yim, Seoul (KR)

(72) Inventors: Masahiro Takahashi, Seongnam-si (KR); Dong Keun Kim, Icheon-si (KR); Hyuck Sang Yim, Seoul (KR)

( * ) Notice: Subject to any disclaimer, the term of this patent is extended or adjusted under 35 U.S.C. 154(b) by 0 days.

(21) Appl. No.: 14/811,237

(22) Filed: Jul. 28, 2015

(65) Prior Publication Data

US 2015/0340087 A1   Nov. 26, 2015

Related U.S. Application Data

(63) Continuation of application No. 14/018,011, filed on Sep. 4, 2013, now Pat. No. 9,123,412.

(60) Provisional application No. 61/804,539, filed on Mar. 22, 2013.

(51) Int. Cl.
    *G11C 7/00* (2006.01)
    *G11C 13/00* (2006.01)
    *G11C 11/16* (2006.01)

(52) U.S. Cl.
    CPC .......... *G11C 13/003* (2013.01); *G11C 11/1659* (2013.01); *G11C 13/0004* (2013.01); *G11C 13/004* (2013.01); *G11C 13/0007* (2013.01); *G11C 2013/0054* (2013.01)

(58) Field of Classification Search
    USPC .................. 365/148, 154, 157, 163, 205, 208
    See application file for complete search history.

(56) References Cited

U.S. PATENT DOCUMENTS

| | | | |
|---|---|---|---|
| 6,191,989 B1 | 2/2001 | Luk et al. | |
| 6,414,520 B1 * | 7/2002 | Dupcak | G01R 19/0084 327/52 |
| 6,819,612 B1 * | 11/2004 | Achter | G11C 7/065 365/189.11 |
| 8,964,450 B2 * | 2/2015 | Ishizu | G11C 11/412 365/149 |
| 2003/0128612 A1 | 7/2003 | Moore et al. | |
| 2007/0280021 A1 | 12/2007 | Ueda et al. | |
| 2009/0296506 A1 * | 12/2009 | Chen | G11C 7/065 365/205 |
| 2011/0051498 A1 | 3/2011 | Shimotori | |
| 2012/0294068 A1 | 11/2012 | Ishizu | |

FOREIGN PATENT DOCUMENTS

| | | |
|---|---|---|
| JP | 2005515577 A | 5/2005 |
| JP | 2007323706 A | 12/2007 |
| JP | 2011054233 A | 3/2011 |

* cited by examiner

*Primary Examiner* — Vu Le
(74) *Attorney, Agent, or Firm* — Holtz, Holtz & Volek PC

(57) ABSTRACT

According to one embodiment, a resistance change memory includes the following configuration. A first inverter includes first input and first output terminals and first and second voltage terminals. A second inverter includes second input and second output terminals and third and fourth voltage terminals. The second input terminal is connected to the first output terminal. The second output terminal is connected to the first input terminal. First and second transistors are connected to the first and second output terminals, respectively. Third and fourth transistors are connected to the first and third voltage terminals, respectively. A fifth transistor is connected between the first voltage terminal and the first memory cell. A sixth transistor is connected to the third voltage terminal. A controller turns on the first and second transistors, after turning off the fifth and sixth transistors.

18 Claims, 10 Drawing Sheets

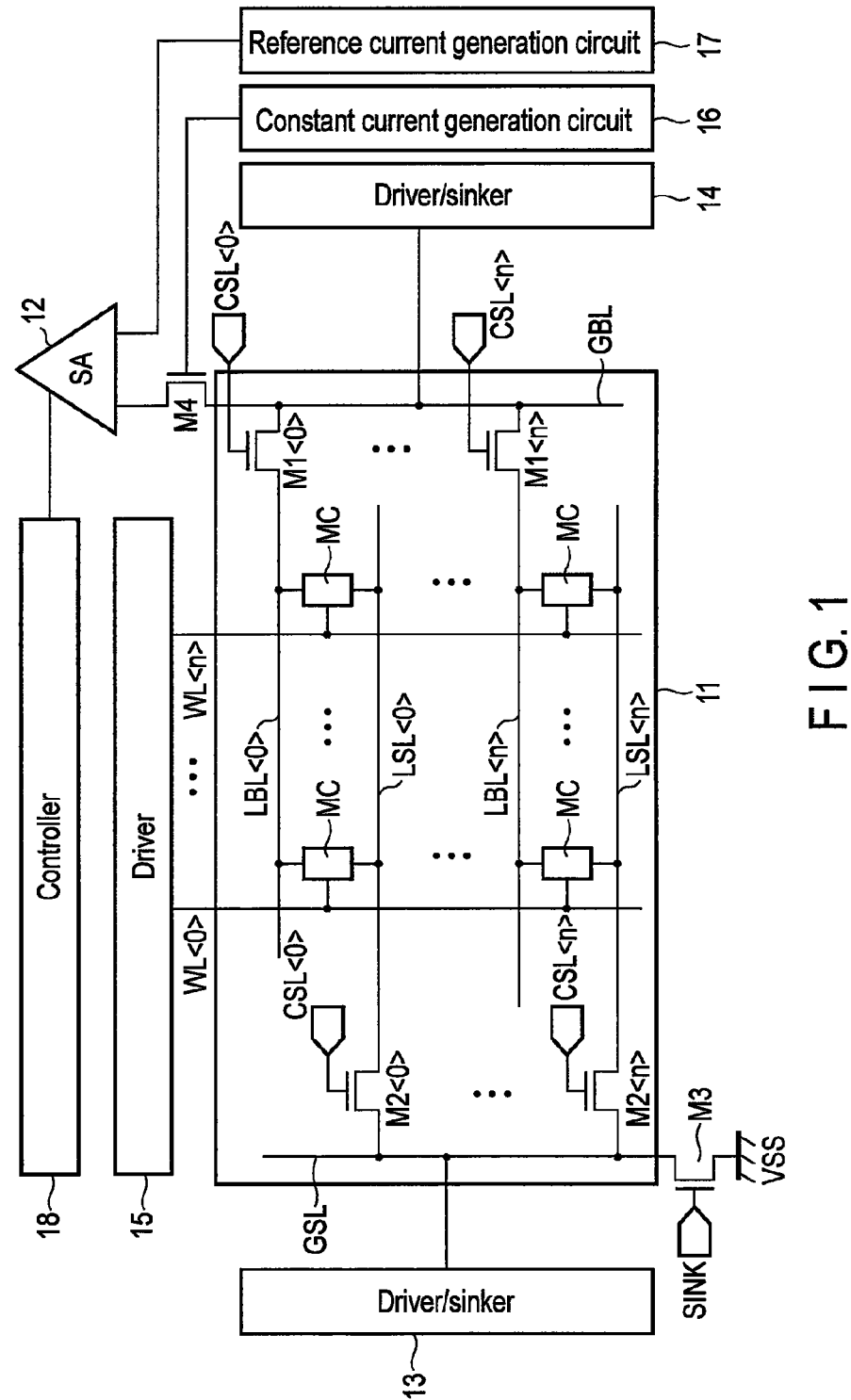
F I G. 1

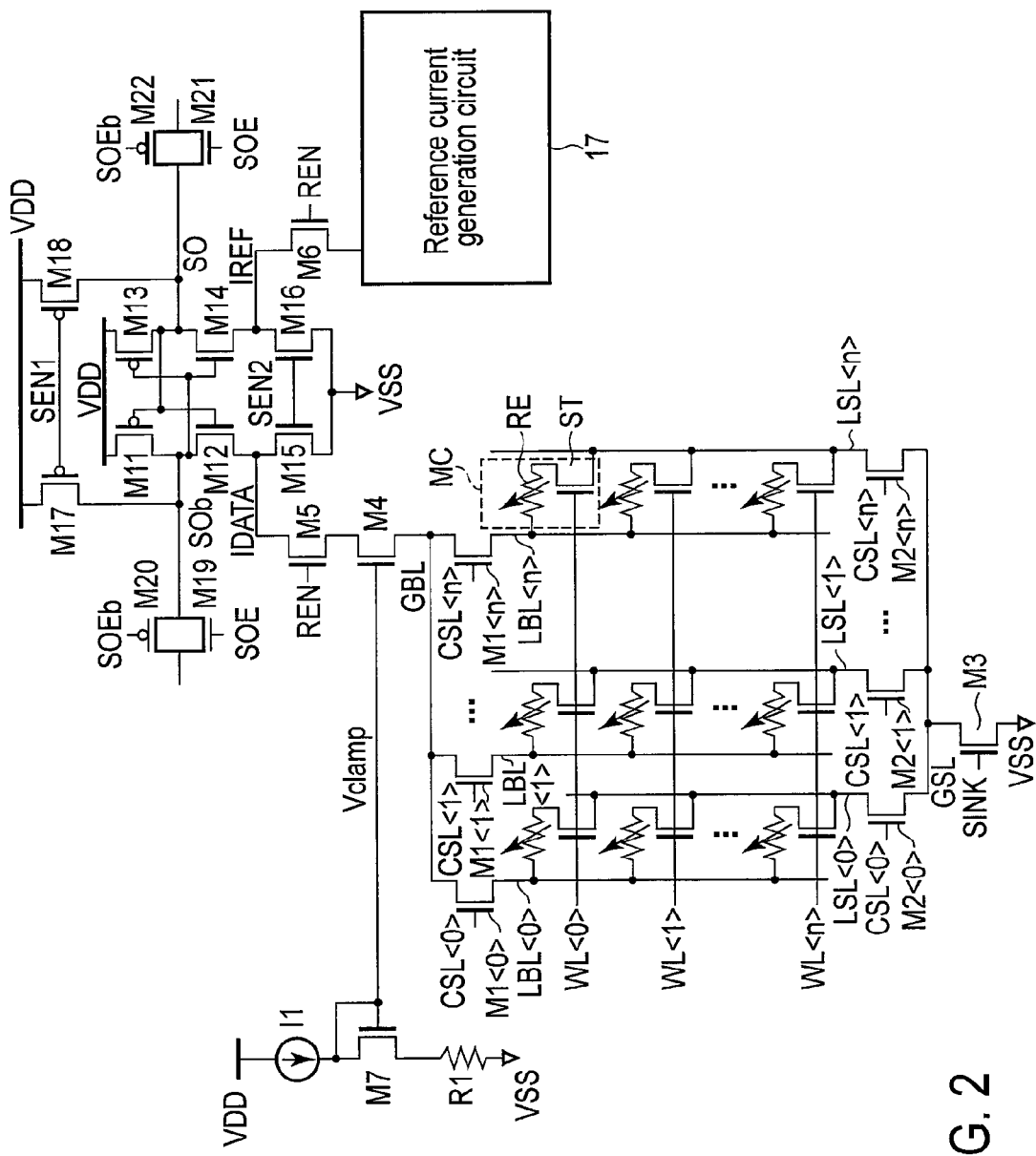
F I G. 2

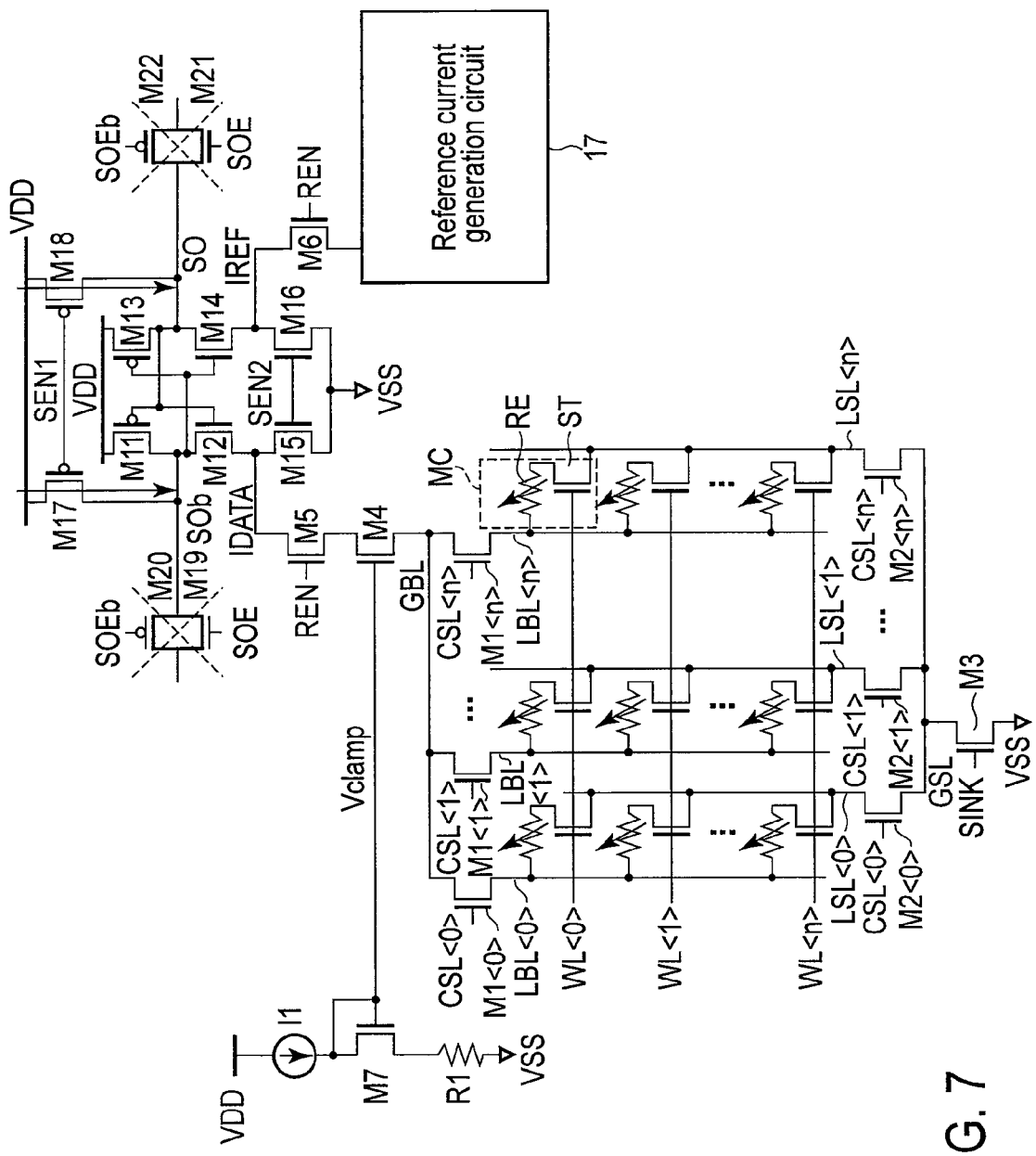
F I G. 7

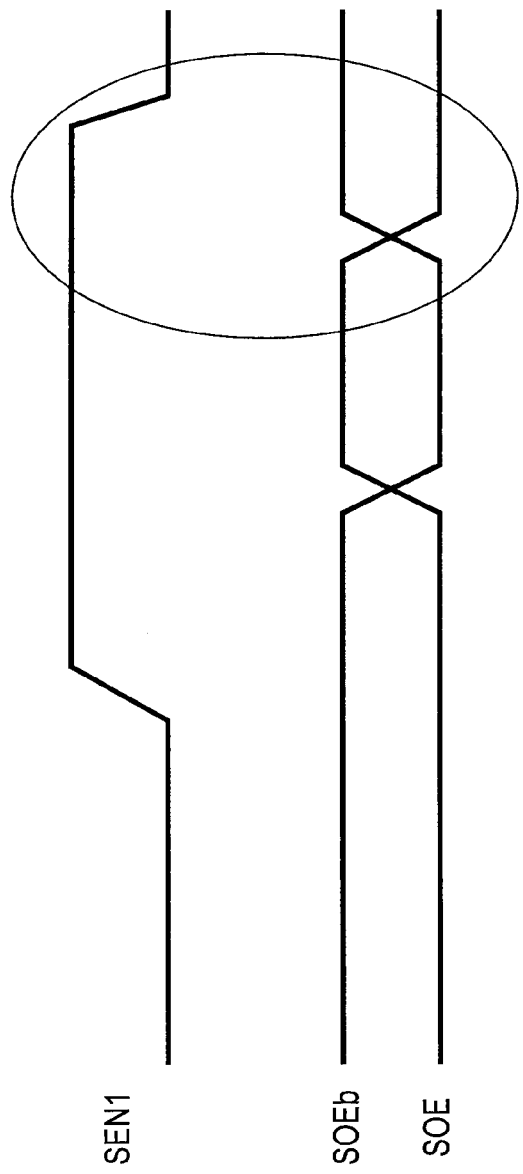
F I G. 8
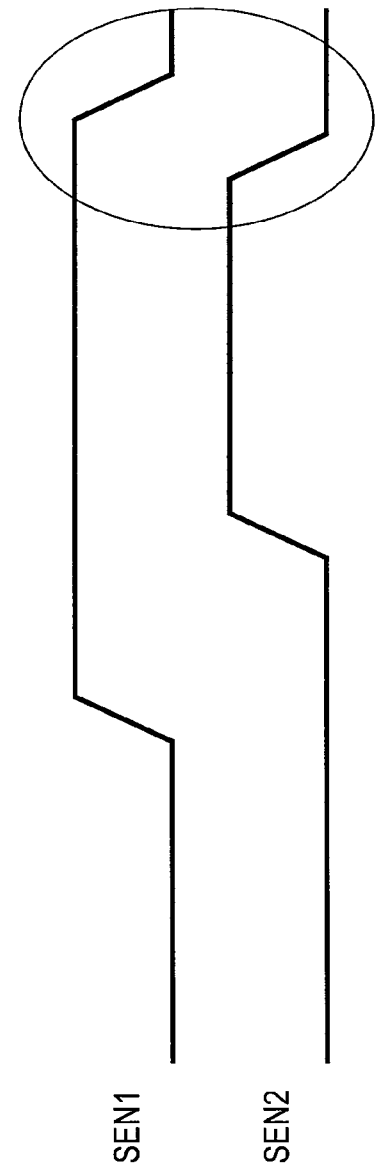
F I G. 10

RESISTANCE CHANGE MEMORY

CROSS-REFERENCE TO RELATED APPLICATIONS

This is a Continuation of U.S. application Ser. No. 14/018,011, filed Sep. 4, 2013, which is based upon and claims the benefit of Provisional U.S. Application No. 61/804,539, filed Mar. 22, 2013, the entire contents of both of which are incorporated herein by reference.

FIELD

Embodiments described herein relate generally to a resistance change memory.

BACKGROUND

Recently, semiconductor memories have attracted attention, which include a nonvolatile memory, such as a resistance change memory (e.g., magnetoresistive random access memory (MRAM), phase change random access memory (PRAM), resistive random access memory (ReRAM), etc.) as a memory device.

A typical resistance change memory is configured to differentiate between data "1" and data "0" by changing its resistance through the supply of a current (or the application of a voltage). In addition, a resistance change memory is equipped with a sense amplifier that senses a slight variation in a read current from each memory cell.

BRIEF DESCRIPTION OF THE DRAWINGS

FIG. 1 is a view illustrating a configuration of a resistance change memory according to a first embodiment;

FIG. 2 is a circuit diagram of a main constituent part of the resistance change memory;

FIG. 7 is a circuit diagram of a sense amplifier in a reset state according to a second embodiment;

FIG. 8 is a timing chart of a reset operation performed by the sense amplifier in the resistance change memory;

FIG. 10 is a timing chart of a reset operation performed by the sense amplifier in the resistance change memory;

DETAILED DESCRIPTION

Figure 3:
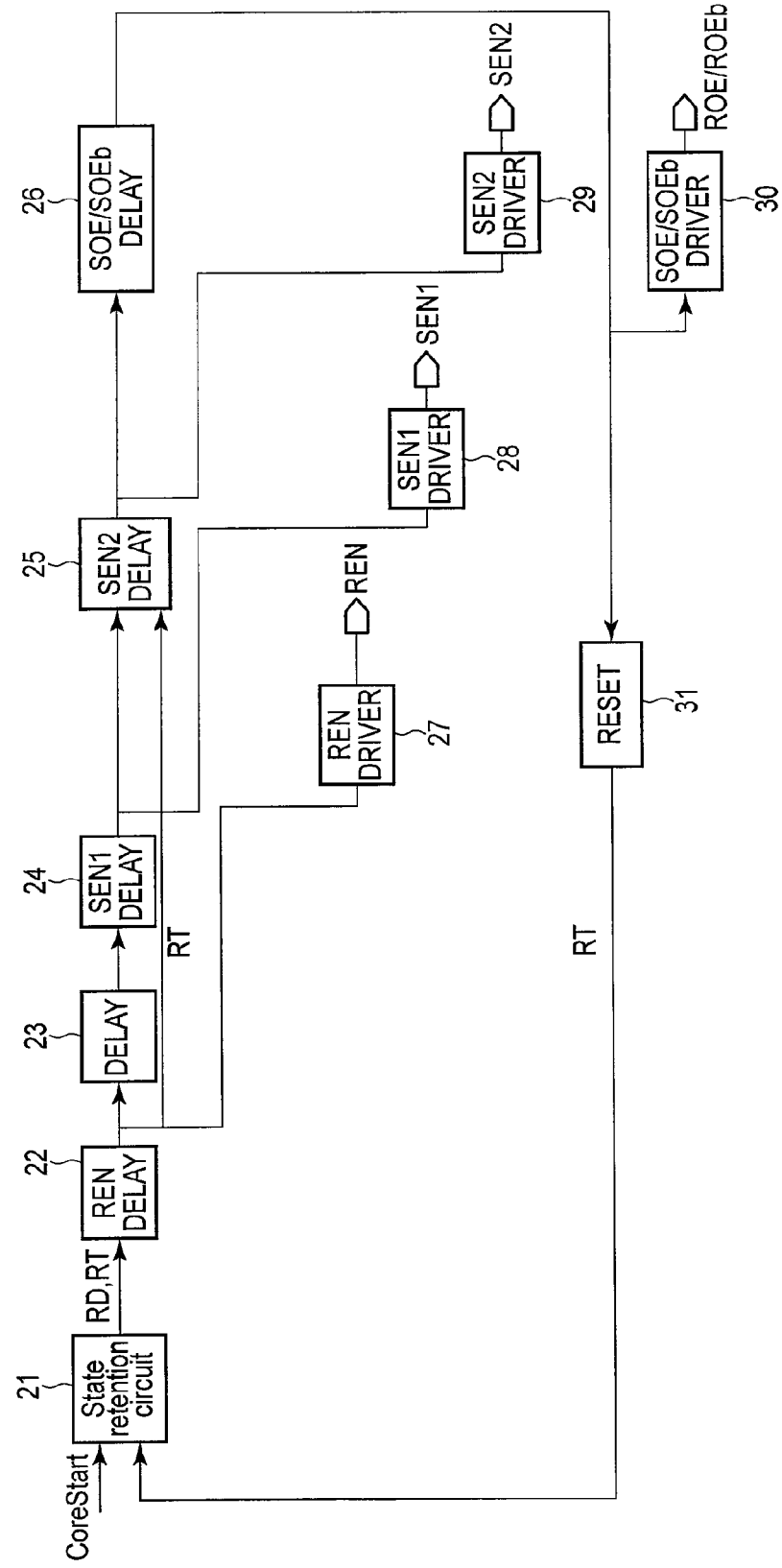
FIG. 3 is a circuit diagram of a generation circuit, which generates a control signal for read and read reset operations performed by the resistance change memory.

Hereinafter, a resistance change memory according to embodiments will be described, with reference to the accompanying drawings. In the following description, the same reference numerals are given to components having the same function and configuration, and an overlapping description will be given only when needed.

In general, according to one embodiment, a resistance change memory includes a first memory cell, a first inverter and a second inverter, a first MOS transistor, a second MOS transistor, a third MOS transistor, a fourth MOS transistor, a fifth MOS transistor, a sixth MOS transistor, and a controller. The first memory cell includes a resistance change element. The first inverter includes a first input terminal, a first output terminal, and first and second voltage terminals. The second inverter includes a second input terminal, a second output terminal, and third and fourth voltage terminals. The second input terminal is connected to the first output terminal. The second output terminal is connected to the first input terminal. The first MOS transistor is connected to the first output terminal. The first MOS transistor has a gate supplied with a first signal. The second MOS transistor is connected to the second output terminal. The second MOS transistor has a gate supplied with the first signal. The third MOS transistor is connected to the first voltage terminal. The fourth MOS transistor is connected to the third voltage terminal. The fifth MOS transistor is connected between the first voltage terminal and the first memory cell. The fifth MOS transistor has a gate supplied with a second signal. The sixth MOS transistor is connected to the third voltage terminal. The sixth MOS transistor has a gate supplied with the second signal. The controller outputs the first and second signals. The controller turns on the first and second MOS transistors by using the first signal, after turning off the fifth and sixth MOS transistors by using the second signal.

First Embodiment

FIG. 1 is a view illustrating a configuration of a resistance change memory according to a first embodiment.

The resistance change memory includes a memory cell array 11, a sense amplifier 12, drivers/sinkers 13 and 14, a driver 15, a constant current generation circuit 16, a reference current generation circuit 17, and a controller 18.

The memory cell array 11 has a plurality of memory cells MC arrayed in a matrix form. The memory cells MC are connected between a local bit line LBL<0> and a local source line LSL<0>, between a local bit line LBL<1> and a local source line LSL<1>, ... and between a local bit line LBL<n> and a local source line LSL<n>, respectively. Furthermore, the memory cells MC are connected to word lines WL<0> to WL<n>, respectively. In other words, the memory cells MC are arranged at locations where the word lines WL<0> to WL<n> intersect both the local bit lines LBL<0> to LBL<n> and the local source lines LSL<0> to LSL<n>, respectively. It should be noted that n represents 0, 1, 2, ... or n.

Ones of the local bit lines LBL<0> to LBL<n> are connected to a global bit line GBL through N-channel MOS field-effect transistors (hereinafter, referred to as nMOS transistors) M1<0> to M1<n>, respectively. Column selection signals CSL<0> to CSL<n> are supplied to the gates of the nMOS transistors M1<0> to M1<n>, respectively. The other end of each of the local bit lines LBL<0> to LBL<n> is connected to the plurality of memory cells MC.

The global bit line GBL is connected to the driver/sinker 14. Furthermore, the global bit line GBL is connected to the sense amplifier 12 through an nMOS transistor M4. The gate of the nMOS transistor M4 is connected to the constant current generation circuit 16 for generating a constant current.

One end of each of the local source lines LSL<0> to LSL<n> is connected to a global source line GSL through nMOS transistors M2<0> to M2<n>, respectively. The column selection signals CSL<0> to CSL<n> are supplied to the gates of the nMOS transistors M2<0> to M2<n>, respectively. The other end of each of the local source lines LSL<0> to LSL<n> is connected to the plurality of memory cells MC.

The global source line GSL is connected to the driver/sinker 13. Furthermore, the global source line GSL is connected to a reference voltage terminal, such as the ground potential terminal Vss, through an nMOS transistor M3. A signal SINK is supplied to the gate of the nMOS transistor M3.

The drivers/sinkers 13 and 14 feed a write current to each memory cell MC in a direction according to data to be written, during a write operation. In this way, the drivers/sinkers 13 and 14 write data into each memory cell MC.

The word lines WL<0> to WL<n> are connected to the driver 15 for driving the word lines WL<0> to WL<n>.

The sense amplifier 12 is connected to the reference current generation circuit 17 for supplying a reference current to the sense amplifier 12. Furthermore, the controller 18 is connected to the sense amplifier 12. The controller 18 controls the operations performed by individual parts of the above resistance change memory. For example, the controller 18 generates a control signal to be supplied to the sense amplifier 12, and controls read and read reset operations performed by the sense amplifier 12.

FIG. 2 is a circuit diagram of a configuration of the memory cell array 11, the sense amplifier 12 and the constant current generation circuit 16 in FIG. 1.

Hereinafter, a configuration of the memory cell array 11 will be described.

The memory cell array 11 has the plurality of memory cells MC arranged in a matrix fashion at the locations where the word lines WL<0> to WL<n> intersect both the local bit lines LBL<0> to LBL<n> and the local source lines LSL<0> to LSL<n>, respectively, as described above. It should be noted that n represents 0, 1, 2, . . . or n.

Each memory cell MC includes, for example, a resistance change element RE and a selection transistor ST. The resistance change element RE is an element that is configured to change in resistance through the supply of a current (or the application of a voltage). Examples of the resistance change element RE include, but are not limited to, a magnetic tunnel junction (MTJ) element, a variable resistive element, a phase change element, and a ferro-electric element. The gate of the selection transistor ST is connected to the word line WL. The selection transistor ST is turned on by the word line WL, whereby the memory cell MC is selected.

Ones of the local bit lines LBL<0> to LBL<n> are connected to the global bit line GBL through the column selection transistors M1<0> to M1<n>, respectively. The column selection signals CSL<0> to CSL<n> are supplied to the gates of the column selection transistors M1<0> to M1<n>, respectively.

The global bit line GBL is connected to a connection node between nMOS transistors M12 and M15 in the sense amplifier 12 through a clamp transistor M4 and a transfer transistor M5, both current paths of which are connected in series to each other.

One end of each of the local source lines LSL<0> to LSL<n> is connected to the global source line GSL through the column selection transistors M2<0> to M2<n>, respectively. The column selection signals CSL<0> to CSL<n> are supplied to the gates of the column selection transistors M2<0> to M2<n>, respectively.

The global source line GSL is connected to the reference voltage terminal, such as the ground potential terminal Vss, through the transfer transistor M3. The signal SINK is supplied to the gate of the transfer transistor M3.

Hereinafter, a configuration of the sense amplifier 12 will be described.

The sense amplifier 12 is a current sensing type of sense amplifier. The sense amplifier 12 is provided with: a first inverter including a P-channel field-effect transistor (hereinafter, referred to as a pMOS transistor) M11 and the N-channel field-effect transistor (hereinafter, referred to as an nMOS transistor) M12; a second inverter including a pMOS transistor M13 and an nMOS transistor M14; nMOS transistors M15 and M16; pMOS transistors M17 and M18; a first pass transistor including an nMOS transistor M19 and a pMOS transistor M20; and a second pass transistor including an nMOS transistor M21 and a pMOS transistor M22.

The first inverter (or the transistors M11 and M12) includes a first input terminal, a first output terminal, and first and second voltage terminals. The second inverter (or the transistors M13 and M14) includes a second input terminal, a second output terminal, and third and fourth voltage terminals. The second input terminal is connected to the first output terminal, and the second output terminal is connected to the first input terminal.

The first output terminal of the first inverter is connected to the drain of the pMOS transistor M17, and the source of the pMOS transistor M17 is connected to a power supply voltage terminal VDD. The second output terminal of the second inverter is connected to the drain of the pMOS transistor M18, and the source of the pMOS transistor M18 is connected to the power supply voltage terminal VDD. A first sense enable signal SEN1 from the controller 18 is supplied to both gates of the nMOS transistors M17 and M18.

The first voltage terminal of the first inverter (or the source of the transistor M12) is connected to the drain of the nMOS transistor M15, and the source of the nMOS transistor M15 is connected to the ground potential terminal Vss. The third voltage terminal of the second inverter (or the source of the transistor M14) is connected to the drain of the nMOS transistor M16, and the source of the nMOS transistor M16 is connected to the ground potential terminal Vss. A second sense enable signal SEN2 from the controller 18 is supplied to both gates of the nMOS transistors M15 and M16.

The first output terminal of the first inverter is connected to the first pass transistor (or the transistors M19 and M20). Output enable signals SOE and SOEb are supplied from the controller 18 to both gates of the transistors M19 and M20, respectively.

The second output terminal of the second inverter is connected to the second pass transistor (or the transistors M21 and M22). The output enable signals SOE and SOEb are supplied from the controller 18 to both gates of the transistors M21 and M22, respectively.

The first voltage terminal of the first inverter (or the source of the transistor M12) is connected to the drain of the nMOS transistor M5. A read enable signal REN from the controller 18 is supplied to the gate of the nMOS transistor M5. The source of the nMOS transistor M5 is connected to the global bit line GBL through the nMOS transistor M4. The gate of the nMOS transistor M4 is connected to the constant current generation circuit 16.

The third voltage terminal of the second inverter (or the source of the transistor M14) is connected to the reference current generation circuit 17 through an nMOS transistor M6. The read enable signal REN from the controller 18 is supplied to the gate of the nMOS transistor M6.

Hereinafter, a configuration of the constant current generation circuit 16 will be described.

The gate of the nMOS transistor M4 is connected to the constant current generation circuit 16. The constant current generation circuit 16 applies a clamp voltage Vclamp (for example, 0.1 to 0.6 V), which is a preset analog voltage, to the gate of the nMOS transistor M4 during a read operation. In response, a voltage at the drain of the nMOS transistor M4 is clamped constant. This constant voltage serves the purpose of limiting a current flowing through each memory cell MC so as not to exceed an upper limit, thus preventing data stored on a selected one of the memory cells MC from being damaged.

The constant current generation circuit 16 includes a constant current source I1, an nMOS transistor M7, and a resistor R1. The drain of the nMOS transistor M7 is connected to the power supply voltage terminal VDD through the constant current source I1, and connected to the gate of the nMOS transistor M7 itself. The source of the nMOS transistor M7 is connected to the ground potential terminal Vss through the resistor R1.

Next, a description will be given of a generation circuit that generates a control signal, which is used for read and read reset operations performed by the resistance change memory as illustrated in FIG. 2.

FIG. 3 depicts a circuit that generates a control signal for the read and read reset operations. This generation circuit is formed, for example, in the controller 18.

The generation circuit, as illustrated in FIG. 3, includes a state retention circuit 21, a read enable delay circuit 22, a delay circuit 23, a first sense enable delay circuit 24, a second sense enable delay circuit 25, an output delay circuit 26, a read enable driver 27, a sense enable driver 28, a sense enable driver 29, an output driver 30, and a reset circuit 31.

The generation circuit, as illustrated in FIG. 3, operates as follows, during the read operation.

The state retention circuit 21 is composed of, for example, a flip flop, and stores "being in a read state." In addition, the state retention circuit 21 outputs a read signal RD. The read signal RD, which the state retention circuit 21 has output, enters the read enable delay circuit 22, and is delayed there. Then, the read enable delay circuit 22 outputs the read signal RD to the read enable driver 27. When receiving the read signal RD, the read enable driver 27 outputs the read enable signal REN.

The read signal RD that the read enable delay circuit 22 has output enters the first sense enable delay circuit 24 through the delay circuit 23. The read signal RD is delayed by the sense enable delay circuit 24, and output to the sense enable driver 28. When receiving the read signal RD, the sense enable driver 28 outputs the sense enable signal SEN1.

The read signal RD that the sense enable delay circuit 24 has output enters the second sense enable delay circuit 25. The read signal RD is delayed by the sense enable delay circuit 25, and output to the sense enable driver 29. When receiving the read signal RD, the sense enable driver 29 outputs the sense enable signal SEN2.

The read signal RD that the sense enable delay circuit 25 has output enters the output delay circuit 26. The read signal RD is delayed by the output delay circuit 26, and output to the output driver 30. When receiving the read signal RD, the output driver 30 outputs the output enable signals SOE and SOEb.

The sense amplifier 12 receives the above read enable signal REN, sense enable signals SEN1 and SEN2, and output enable signals SOE and SOEb in this order from the controller 18, and performs the read operation.

The circuit, as illustrated in FIG. 3, operates as follows, during the read reset operation that terminates the read operation and is performed after the read operation.

The read signal RD that the output delay circuit 26 has output is, for example, a pulse signal, and enters the reset circuit 31. When the reset circuit 31 receives the read signal RD of a pulse waveform, it outputs a reset signal RT to the state retention circuit 21 by using a falling edge of the read signal RD. When receiving the reset signal RT, the state retention circuit 21 stores "being in a reset state." In addition, the state retention circuit 21 outputs the reset signal RT.

The reset signal RT that the state retention circuit 21 has output enters the read enable delay circuit 22. Then, the read enable delay circuit 22 outputs the reset signal RT to the read enable driver 27. When receiving the reset signal RT, the read enable driver 27 outputs the read enable signal REN ("Low").

The reset signal RT that the read enable delay circuit 22 has output enters the sense enable delay circuit 25. Then, the sense enable delay circuit 25 outputs the reset signal RT to the sense enable driver 29. When receiving the reset signal RT, the sense enable driver 29 outputs the sense enable signal SEN2 ("Low").

In parallel, the reset signal RT that the read enable delay circuit 22 has output is delayed by the delay circuit 23, and enters the first sense enable delay circuit 24. Then, the sense enable delay circuit 24 outputs the reset signal RT to the sense enable driver 28. When receiving the reset signal RT, the sense enable driver 28 outputs the sense enable signal SEN1 ("Low"). Since the reset signal RT is delayed by the delay circuit 23 in this manner, the sense enable signal SEN1 is output later than the sense enable signal SEN2.

The sense amplifier 12 receives the above output enable signals SOE and SOEb, read enable signal REN, the sense enable signals SEN2 and SEN1 in this order from the controller 18, and performs the read reset operation following the read operation.

Next, a description will be given of the read operation performed by the resistance change memory, with reference to FIG. 4.

Figure 4:
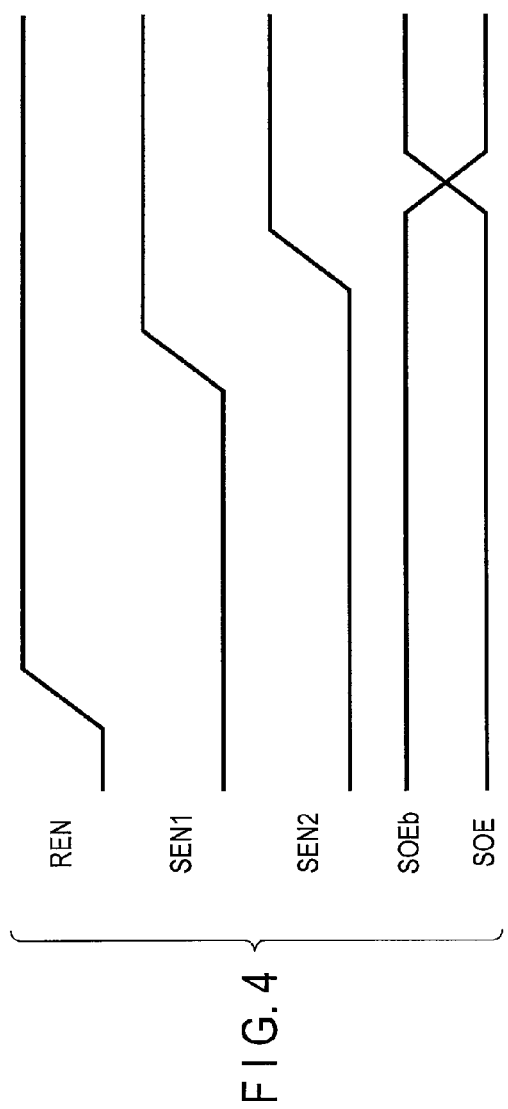
FIG. 4 is a timing chart of the read operation performed by the resistance change memory.

FIG. 4 is a timing chart of the read operation performed by the resistance change memory.

In the memory cell array 11, first, the local bit line LBL<n> and the local source line LSL<n> are selected through the column selection signal CSL<n>. In addition, the word line WL<n> is driven, so that the memory cell MC to be read is selected. In this case, the nMOS transistor M3 is in an on state through the signal SINK, during the read operation.

In the sense amplifier 12, the nodes SO and SOb are precharged at the potential of the power supply voltage VDD as an initial state. The constant analog voltage Vclamp is applied to the nMOS transistor M4, and the nMOS transistor M4 is in an on state during the read operation.

First, by setting the level of the read enable signal REN to "High," the nMOS transistor M5 is turned on. As a result, a read current is fed from the sense amplifier 12 to the selected memory cell MC.

Next, by setting the level of the first sense enable signal SEN1 to "High," both pMOS transistors M17 and M18 are turned off. As a result, precharging both nodes SO and SOb is stopped. Then, the read current becomes a current supplied only from the power supply voltage terminal VDD to which both drains of the nMOS transistors M11 and M13 are connected. In this case, the read current is changed depending on data ("0" or "1") stored on the selected memory cell MC. In other words, the read current is changed depending on which of the low and high resistance states the selected memory cell MC assumes. The read current changed in this manner, namely, depends on the data of the selected memory cell MC refers to a cell current IDATA.

After that, by setting the level of the second sense enable signal SEN2 to "High," both nMOS transistors M15 and M16 are turned on. In response, the reference current IREF driven by the reference current generation circuit 17 is compared with the cell current IDATA. As a result, a level of a latch circuit including the pMOS transistors M11 and M13 and the nMOS transistors M12 and M14 is retained at a "High" or "Low" level, in accordance with the comparison result. Here, the reference current IREF is set to an intermediate value between respective cell currents which cause the memory cell to store "0" and "1." The reference current IREF may be generated by, for example, a reference memory cell.

Finally, by setting both levels of the output enable signals SOE and SOEb to "High" and "Low," respectively, the nMOS transistors M19 and M21 and the pMOS transistors M20 and M22 are turned on. As a result, (data in) a "High" or "Low" level which is retained in the latch circuit is transferred.

It should be noted that data on the memory cell MC is likely to be damaged by the read current, with a certain probability. This probability, with which the data is damaged, is dependent on the read current and the read operation time. In more detail, as the read current increases, the data is more likely to be damaged. Likewise, as the read operation time extends, the data is more likely to be damaged.

Next, a description will be given of the read reset operation (or a reset timing thereof) performed by the sense amplifier 12 after the read operation.

Figure 6:
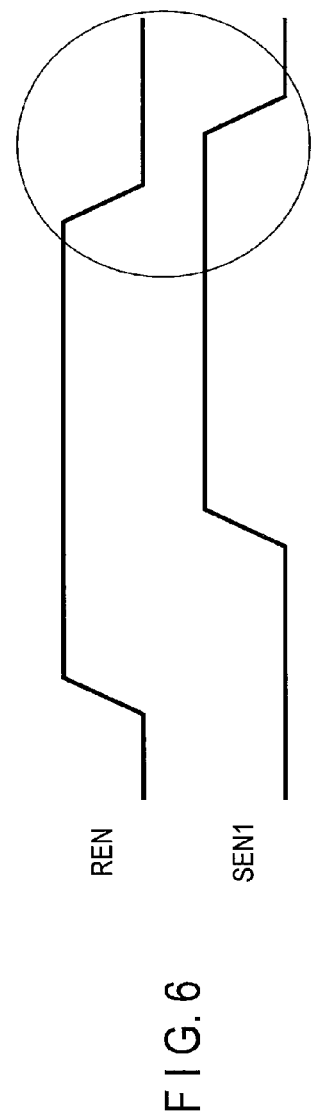
FIG. 6 is a timing chart of a reset operation performed by the sense amplifier in the resistance change memory.
Figure 5:
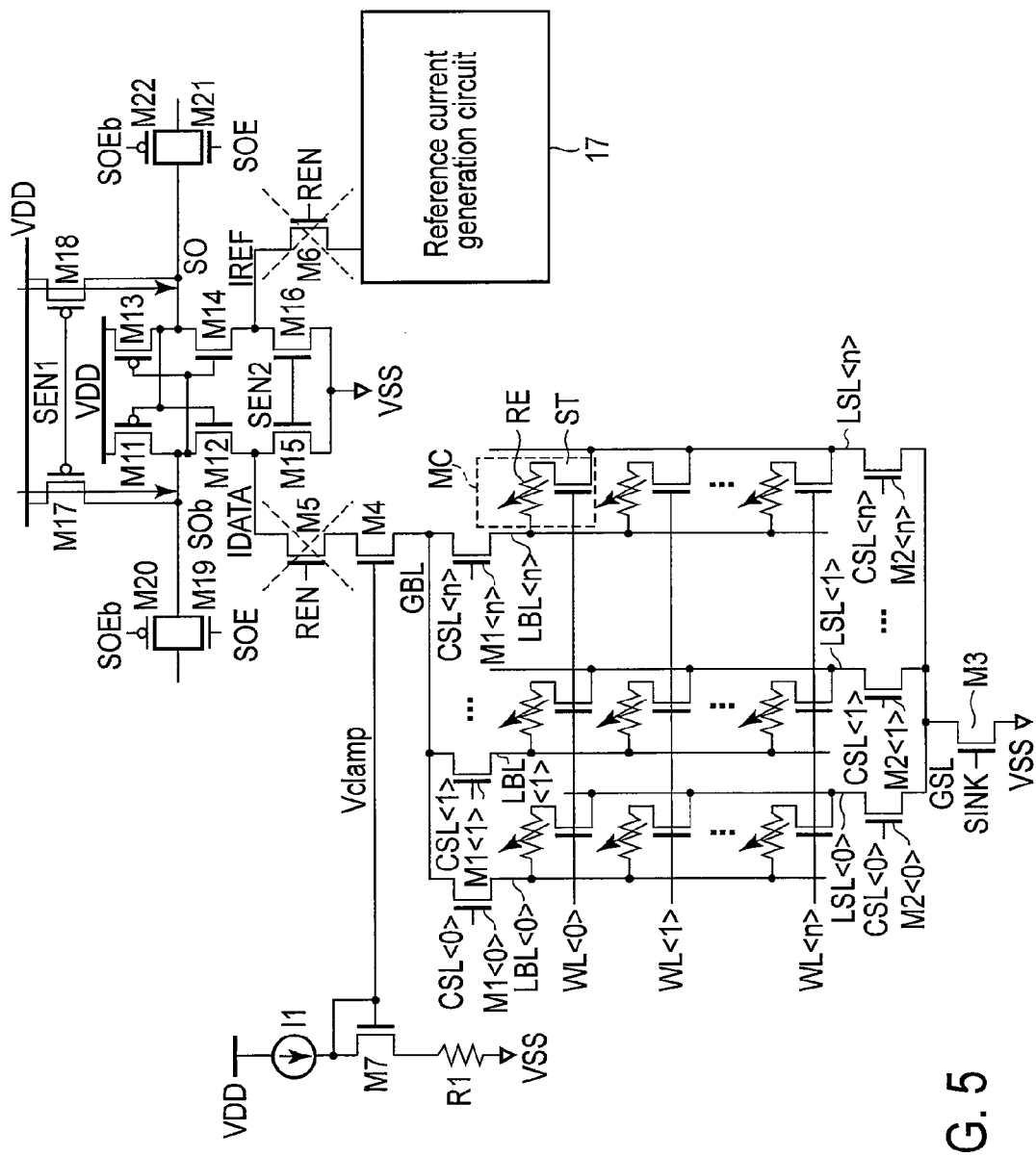
FIG. 5 is a circuit diagram of a sense amplifier in a reset state in the resistance change memory.

FIG. 5 is a circuit diagram of the sense amplifier 12 in a reset state according to the first embodiment. FIG. 6 is a timing chart of a read reset operation performed by the sense amplifier 12 according to the first embodiment.

For example, it is assumed that during the read reset operation, before the level of the read enable signal REN is set to "Low" whereby the nMOS transistor M5 enters an off state, the level of the sense enable signal SEN1 is set to "Low" whereby both the pMOS transistors M17 and M18 enter an on state. In this case, the read current is prone to flow through the selected memory cell MC, regardless of whether the read operation is performed or not. Consequently, the probability with which the memory cell MC is damaged increases.

In the first embodiment, however, the level of the read enable signal REN is set to "Low," whereby the nMOS transistors M5 and M6 are turned off, as illustrated in FIGS. 5 and 6. Subsequently, the level of the first sense enable signal SEN1 is set to "Low," whereby both pMOS transistors M17 and M18 are turned on. As a result, both nodes SO and SOb are precharged.

In other words, before the pMOS transistors M17 and M18 are activated by the first sense enable signal SEN1, the nMOS transistors M5 and M6 are inactivated by the read enable signal REN. As a result, a current path is cut off from the sense amplifier 12 to the memory cell MC.

Employing the above reset timing makes it possible to decrease the read current that unnecessarily flows through the memory cell MC, thereby preventing the increase in the probability with which this unnecessary read current damages the data on the memory cell MC.

The read enable signal REN and the first sense enable signal SEN1 are controlled by the generation circuit, as illustrated in FIG. 3, in the controller 12. These signals may be generated, for example, by a delay circuit, or a circuit controlled by using another signal as a trigger.

Second Embodiment

As for a second embodiment, a description will be given of an example of avoiding the damage of the read data or the output of erroneous data.

A configuration of a resistance change memory according to this embodiment, namely, configurations of a memory cell array, a sense amplifier, and a constant current generation circuit are the same as those of the first embodiment as illustrated in FIGS. 1 to 3. Therefore, the descriptions thereof will be omitted.

FIG. 7 is a circuit diagram of a sense amplifier 12 in a reset state according to the second embodiment. FIG. 8 is a timing chart of a read reset operation performed by the sense amplifier 12 according to the second embodiment.

For example, it is assumed that during a read reset operation, before both levels of output enable signals SOE and SOEb are set to "Low" and "High," respectively whereby nMOS transistors M19 and M21 and pMOS transistors M20 and M22 enter an off state, the level of a first sense enable signal SEN1 is set to "Low" whereby both pMOS transistors M17 and M18 enter an on state. In this case, both nodes SO and SOb are precharged while first and second pass transistors for transferring read data are in an on state. Consequently, read data transferred from a latch circuit to both nodes SO and SOb may be damaged, so that erroneous data would be output therefrom.

In the second embodiment, however, the level of an output enable signal SOE is set to "Low" whereby both nMOS transistors M19 and M21 are turned off, and an output enable signal SOEb is set to "High" whereby both pMOS transistors M20 and M22 are turned off, as illustrated in FIGS. 7 and 8. As a result, both the first pass transistor including the nMOS transistor M19 and the pMOS transistor M20 and the second pass transistor including the nMOS transistor M21 and the pMOS transistor M22 enter a non-conducting state. Then, by setting the level of the first sense enable signal SEN1 to "Low," both pMOS transistors M17 and M18 are turned on. As a result, both nodes SO and SOb are precharged.

In other words, before both pMOS transistors M17 and M18 are activated by the first sense enable signal SEN1, the nMOS transistors M19 and M21 and the pMOS transistors M20 and M22 are inactivated by the output enable signals SOE and SOEb. Specifically, before the precharging transistor is turned on, the pass transistors for transferring the read data are turned off. Consequently, it is possible to avoid the damage of the read data that has been transferred from the latch circuit to the nodes SO and SOb, by cutting off a current path to the read data.

The output enable signals SOE and SOEb and the first sense enable signal SEN1 are controlled by a generation circuit, as illustrated in FIG. 3, in the controller 12. These signals may be generated, for example, by a delay circuit, or a circuit controlled by using another signal as a trigger.

Third Embodiment

As for a third embodiment, a description will be given of an example of preventing a short-circuit current from flowing through a current path which is generated from a power supply voltage terminal VDD to a ground potential terminal Vss in a sense amplifier 12.

A configuration of a resistance change memory according to this embodiment, namely, configurations of a memory cell array, a sense amplifier, and a constant current generation circuit are the same as those of the first embodiment as illustrated in FIGS. 1 to 3. Therefore, the descriptions thereof will be omitted.

Figure 9:
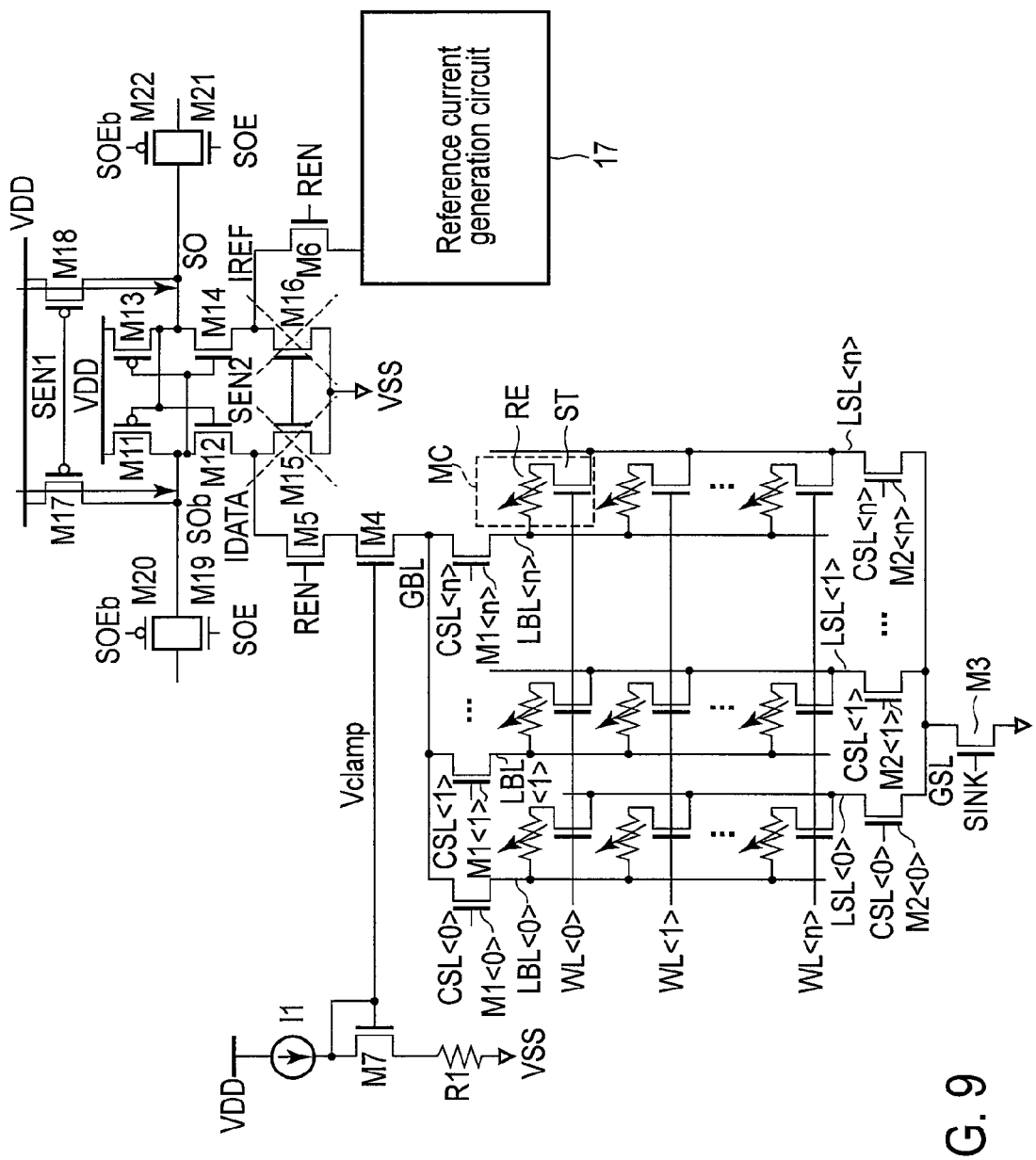
FIG. 9 is a circuit diagram of a sense amplifier in a reset state according to a third embodiment.

FIG. 9 is a circuit diagram of the sense amplifier 12 in a reset state according to the third embodiment. FIG. 10 is a timing chart of a read reset operation performed by the sense amplifier 12 according to the third embodiment.

For example, it is assumed that during the read reset operation, before the level of a second sense enable signal SEN2 is set to "Low" whereby both nMOS transistors M15 and M16 enter an off state, the level of a first sense enable signal SEN1 is set to "Low" whereby both pMOS transistors M17 and M18 enter an on state. In this case, a current path may be generated from a power supply voltage terminal VDD to a ground potential terminal Vss in the sense amplifier 12, and a short-circuit current could flow therethrough.

In the third embodiment, however, the level of the second sense enable signal SEN2 is set to "Low," whereby both nMOS transistors M15 and M16 are turned off, as illustrated in FIGS. 9 and 10. Subsequently, the level of the first sense enable signal SEN1 is set to "Low," whereby both pMOS transistors M17 and M18 are turned on. As a result, both nodes SO and SOb are pre charged.

In other words, before both pMOS transistors M17 and M18 are activated by the first sense enable signal SEN1, both nMOS transistors M15 and M16 are inactivated by the second sense enable signal SEN2. As a result, the current path is cut off from the power supply voltage terminal VDD to the ground potential terminal Vss. Consequently, this embodiment prevents the short-circuit current from flowing in the sense amplifier 12, thereby decreasing the power consumption.

The first and second sense enable signals SEN1 and SEN2 are controlled by the generation circuit, as illustrated in FIG. 3, in the controller 12. These signals may be generated, for example, by a delay circuit, or a circuit controlled by using another signal as a trigger.

Fourth Embodiment

As for a fourth embodiment, a description will be given of an example of performing the operations according to the first to third embodiments as a series of operations.

A configuration of a resistance change memory according to this embodiment, namely, configurations of a memory cell array, a sense amplifier, and a constant current generation circuit are the same as those of the first embodiment as illustrated in FIGS. 1 to 3. Therefore, the descriptions thereof will be omitted.

Figure 11:
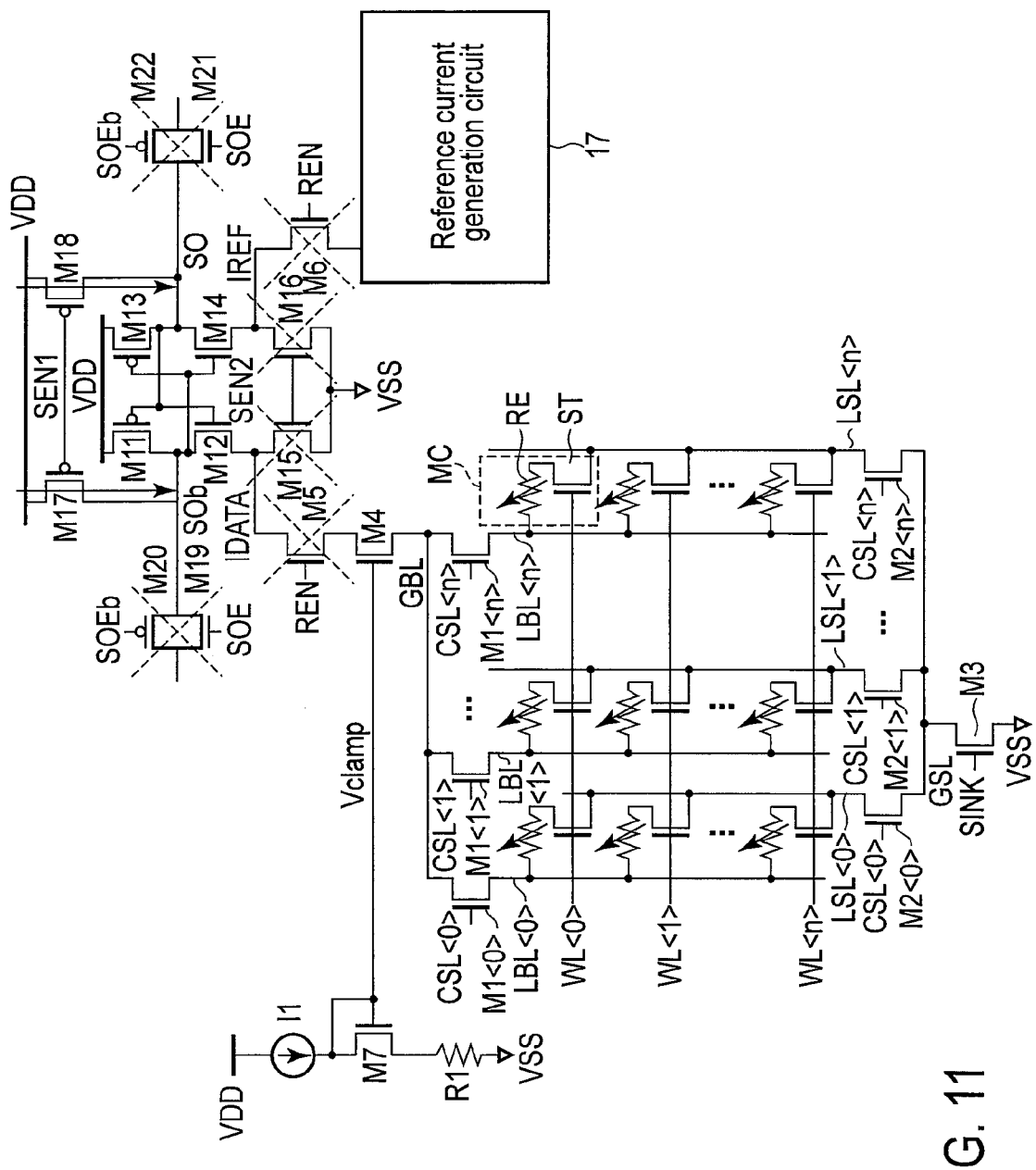
FIG. 11 is a circuit diagram of a sense amplifier in a reset state according to a fourth embodiment.
Figure 12:
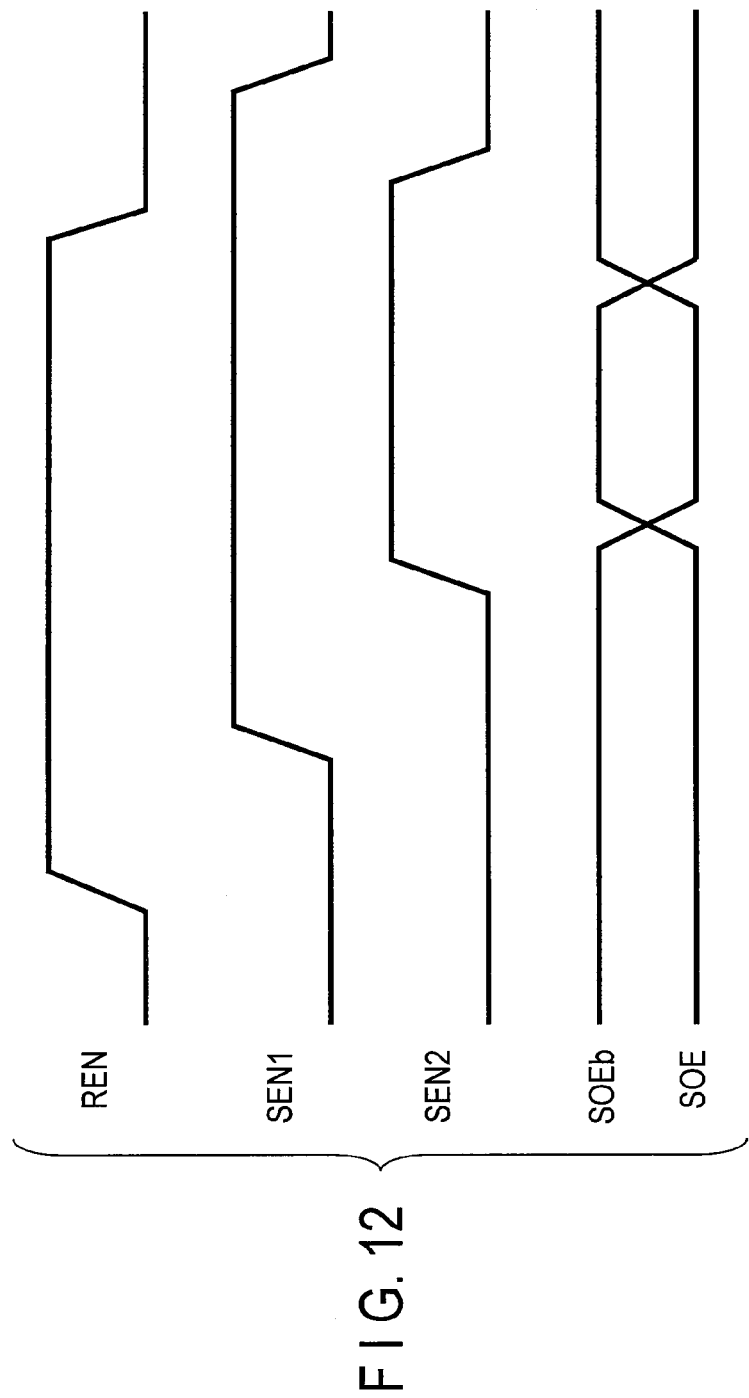
FIG. 12 is a timing chart of a reset operation performed by the sense amplifier in the resistance change memory.

FIG. 11 is a circuit diagram of a sense amplifier 12 in a reset state according to the fourth embodiment. FIG. 12 is a timing chart of a read reset operation performed by the sense amplifier 12 according to the fourth embodiment.

In the fourth embodiment, first, the level of an output enable signal SOE is set to "Low" whereby both nMOS transistors M19 and M21 are turned off, and the level of an output enable signal SOEb is set to "High" whereby both pMOS transistors M20 and M22 are turned off, as illustrated in FIGS. 11 and 12. As a result, both a first pass transistor including the nMOS transistor M19 and the pMOS transistor M20 and a second pass transistor including the nMOS transistor M21 and the pMOS transistor M22 enter a non-conducting state.

Then, by setting the level of a read enable signal REN to "Low," both nMOS transistors M5 and M6 are turned off.

Subsequently, by setting the level of a second sense enable signal SEN2 to "Low," both nMOS transistors M15 and M16 are turned off.

Followed by, by setting the level of a first sense enable signal SEN1 to "Low," both pMOS transistors M17 and M18 are turned on.

Thus, first, the first pass transistor including the transistors M19 and M20 and the second pass transistor including the transistors M21 and M22 enter the non-conducting state, in response to the output enable signals SOE and SOEb. Then, both transistors M5 and M6 are turned off by the read enable signal REN. Subsequently, both transistors M15 and M16 are turned off by the second sense enable signal SEN2. Finally, both transistors M17 and M18 are turned on by the first sense enable signal SEN1.

By performing the above sequence of operations, first, the current path to the read data transferred to the nodes SO and SOb is cut off. Then, the current path is cut off from the sense amplifier 12 to the memory cell MC. Finally, the current path is cut off from the power supply voltage terminal VDD to the ground potential terminal Vss in the sense amplifier 12, so as not to be generated therein, and the nodes SO and SOb are precharged.

This embodiment makes it possible to avoid: the damage of the read data transferred from a latch circuit to the nodes SO and SOb; the increase in a probability of damaging the data which is caused by the unnecessary read current; and the generation of a short-circuit current that would flow from the power supply voltage terminal VDD to the ground potential terminal Vss.

The output enable signals SOE and SOEb, the read enable signal REN, and the first and second sense enable signals SEN1 and SEN2 are controlled by the generation circuit, as illustrated in FIG. 3, in the controller 12. These signals may be generated, for example, by a delay circuit, or a circuit controlled by using another signal as a trigger.

Effect

The above embodiments are applicable to memories into which data is written with a current, including MRAMs having magnetoresistive effect elements, ReRAMs having variable resistive elements, and PRAMs having phase change elements.

For example, an MRAM includes a magnetoresistive element called a magnetic tunnel junction (MTJ) element, as a memory element. Such an MTJ element includes a fixed layer (or a reference layer), a recording layer (or a free layer), and an insulating layer that is sandwiched therebetween. The fixed layer has a magnetization direction which is fixed by an antiferromagnetic layer. The recording layer has a magnetization direction which can be inverted freely. The MTJ element utilizes the change in the resistance caused by the relative magnetization direction in the recording layer with respect to the fixed layer, which is called a magnetoresistive effect. Thus, the MTJ element differentiates between data "1" and data "0" by utilizing a relative difference between respective resistances in the magnetization direction.

A mechanism for writing data into an MRAM, such as a spin injection type of MRAM, operates as follows. When data "1" is written into the MRAM, a current is fed thereto in a direction from the fixed layer to the recording layer of the MTJ element. Meanwhile, when data "0" is written into the MRAM, a current is fed thereto in a direction from the recording layer to the fixed layer of the MTJ element.

The embodiments, as described above, make it possible to prevent the cell data from being damaged, by activating the initializing signal (or the first sense enable signal) of the sense amplifier after inactivating the reading start signal (or the read enable signal). Furthermore, the embodiments make it possible to prevent the output data from being damaged, by activating the initializing signal of the sense amplifier after inactivating the transfer start signal (or the output enable signal) of the read data. Moreover, the embodiments make it possible to prevent a short-circuit current from flowing in the sense amplifier, by activating the initializing signal of the sense amplifier after inactivating the latch start signal (or the second sense enable signal).

The overall configuration of the resistance change memory according to each embodiment, namely, the configurations of the memory cell array, memory cells, sense amplifier, drivers/sinkers, driver, constant current generation circuit, reference current generation circuit, and the like are not limited to those of the above examples. For example, the structure disclosed by U.S. Pat. No. 7,649,792 or U.S. Patent Application Publication No. 2012/0286339 may be employed. The contents of these specifications are entirely incorporated herein by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a first memory cell including a resistance change element;
   a first bit line electrically coupled to the first memory cell;
   a sense amplifier which compares a reference current with a read current flowing through the first bit line, the sense amplifier including a first inverter, a second inverter, a first transistor, a second transistor, a third transistor and a fourth transistor, wherein:
      the first transistor is electrically coupled between an output terminal of the first inverter and a first voltage source and has one of a conduction state and a cutoff state according to a first signal supplied to a gate of the first transistor,
      the second transistor is electrically coupled between a first voltage terminal of the first inverter and a second voltage source and has one of the conduction state and the cutoff state according to a second signal supplied to a gate of the second transistor,
      the third transistor is electrically coupled to the output terminal of the first inverter and transfers and interrupts a signal from the output terminal of the first inverter, and
      the fourth transistor is electrically coupled between the first voltage terminal of the first inverter and the first bit line and has one of the conduction state and the cutoff state according to a fourth signal supplied to a gate of the fourth transistor;
   a fifth transistor which is electrically coupled between the fourth transistor and the first bit line and which has one of the conduction state and the cutoff state according to a fifth signal supplied to a gate of the fifth transistor; and
   a current generation circuit which supplies the reference current to the sense amplifier;
   wherein when the fourth transistor has the cutoff state, the first transistor has the conduction state.

2. The resistance change memory according to claim 1, further comprising:
   a second memory cell including a resistance change element;
   a second bit line electrically coupled to the second memory cell; and
   a third bit line electrically coupled to the first and second bit lines.

3. The resistance change memory according to claim 1, further comprising:
   a sixth transistor which is electrically coupled between the fifth transistor and the first bit line and which has one of the conduction state and the cutoff state according to a sixth signal supplied to a gate of the sixth transistor.

4. The resistance change memory according to claim 1, wherein in a reset operation after a read operation is carried out, when the fourth transistor has the cutoff state, the first transistor has the conduction state.

5. The resistance change memory according to claim 1, wherein the output terminals of the first and second inverters are electrically coupled to the first voltage source.

6. The resistance change memory according to claim 1, wherein the resistance change element includes a magnetic tunnel junction (MTJ) element the resistance of which is changed through at least one of supply of a current thereto and application of a voltage thereto.

7. A resistance change memory comprising:
   a first memory cell including a resistance change element;
   a first bit line electrically coupled to the first memory cell;
   a sense amplifier which compares a reference current with a read current flowing through the first bit line, the sense amplifier including a first inverter, a second inverter, a first transistor, a second transistor, a third transistor and a fourth transistor, wherein:
      the first transistor is electrically coupled between an output terminal of the first inverter and a first voltage source and has one of a conduction state and a cutoff state according to a first signal supplied to a gate of the first transistor,
      the second transistor is electrically coupled between a first voltage terminal of the first inverter and a second voltage source and has one of the conduction state and the cutoff state according to a second signal supplied to a gate of the second transistor,
      the third transistor is electrically coupled to the output terminal of the first inverter and transfers and interrupts a signal from the output terminal of the first inverter, and
      the fourth transistor is electrically coupled between the first voltage terminal of the first inverter and the first bit line and has one of the conduction state and the cutoff state according to a fourth signal supplied to a gate of the fourth transistor;
   a fifth transistor which is electrically coupled between the fourth transistor and the first bit line and which has one of the conduction state and the cutoff state according to a fifth signal supplied to a gate of the fifth transistor; and
   a current generation circuit which supplies the reference current to the sense amplifier;
   wherein when the third transistor has the cutoff state, the first transistor has the conduction state.

8. The resistance change memory according to claim 7, further comprising:
   a second memory cell including a resistance change element;
   a second bit line electrically coupled to the second memory cell; and
   a third bit line electrically coupled to the first and second bit lines.

9. The resistance change memory according to claim 7, further comprising:
   a sixth transistor which is electrically coupled between the fifth transistor and the first bit line and which has one of the conduction state and the cutoff state according to a sixth signal supplied to a gate of the sixth transistor.

10. The resistance change memory according to claim 7, wherein in a reset operation after a read operation is carried out, when the fourth transistor has the cutoff state, the first transistor has the conduction state.

11. The resistance change memory according to claim 7, wherein the output terminals of the first and second inverters are electrically coupled to the first voltage source.

12. The resistance change memory according to claim 7, wherein the resistance change element includes a magnetic tunnel junction (MTJ) element the resistance of which is changed through at least one of supply of a current thereto and application of a voltage thereto.

13. A resistance change memory comprising:
a first memory cell including a resistance change element;
a first bit line electrically coupled to the first memory cell;
a sense amplifier which compares a reference current with a read current flowing through the first bit line, the sense amplifier including a first inverter, a second inverter, a first transistor, a second transistor, a third transistor and a fourth transistor, wherein:
  the first transistor is electrically coupled between an output terminal of the first inverter and a first voltage source and has one of a conduction state and a cutoff state according to a first signal supplied to a gate of the first transistor,
  the second transistor is electrically coupled between a first voltage terminal of the first inverter and a second voltage source and has one of the conduction state and the cutoff state according to a second signal supplied to a gate of the second transistor,
  the third transistor is electrically coupled to the output terminal of the first inverter and transfers and interrupts a signal from the output terminal of the first inverter, and
  the fourth transistor is electrically coupled between the first voltage terminal of the first inverter and the first bit line and has one of the conduction state and the cutoff state according to a fourth signal supplied to a gate of the fourth transistor;
  a fifth transistor which is electrically coupled between the fourth transistor and the first bit line and which has one of the conduction state and the cutoff state according to a fifth signal supplied to a gate of the fifth transistor; and
  a current generation circuit which supplies the reference current to the sense amplifier;
wherein when the second transistor has the cutoff state, the first transistor has the conduction state.

14. The resistance change memory according to claim 13, further comprising:
a second memory cell including a resistance change element;
a second bit line electrically coupled to the second memory cell; and
a third bit line electrically coupled to the first and second bit lines.

15. The resistance change memory according to claim 13, further comprising:
a sixth transistor which is electrically coupled between the fifth transistor and the first bit line and which has one of the conduction state and the cutoff state according to a sixth signal supplied to a gate of the sixth transistor.

16. The resistance change memory according to claim 13, wherein in a reset operation after a read operation is carried out, when the fourth transistor has the cutoff state, the first transistor has the conduction state.

17. The resistance change memory according to claim 13, wherein the output terminals of the first and second inverters are electrically coupled to the first voltage source.

18. The resistance change memory according to claim 13, wherein the resistance change element includes a magnetic tunnel junction (MTJ) element the resistance of which is changed through at least one of supply of a current thereto and application of a voltage thereto.

* * * * *